(12) United States Patent
Chen et al.

(10) Patent No.: US 10,629,593 B2
(45) Date of Patent: Apr. 21, 2020

(54) FORMATION OF SEMICONDUCTOR DEVICE WITH RESISTORS HAVING DIFFERENT RESISTANCES

(71) Applicant: TAIWAN SEMICONDUCTOR MANUFACTURING CO., LTD., Hsinchu (TW)

(72) Inventors: Yu-Jen Chen, Tainan (TW); Ping-Pang Hsieh, Tainan (TW); Hsin-Chi Chen, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/134,272

(22) Filed: Apr. 20, 2016

(65) Prior Publication Data

US 2016/0233215 A1   Aug. 11, 2016

Related U.S. Application Data

(62) Division of application No. 14/091,643, filed on Nov. 27, 2013, now Pat. No. 9,349,785.

(51) Int. Cl.
| | | |
|---|---|---|
| H01L 27/08 | (2006.01) | |
| H01L 49/02 | (2006.01) | |
| H01L 29/06 | (2006.01) | |
| H01L 21/762 | (2006.01) | |
| H01L 21/265 | (2006.01) | |

(52) U.S. Cl.
CPC .... *H01L 27/0802* (2013.01); *H01L 21/76224* (2013.01); *H01L 28/20* (2013.01); *H01L 29/0649* (2013.01); *H01L 21/2652* (2013.01)

(58) Field of Classification Search
None
See application file for complete search history.

(56) References Cited

U.S. PATENT DOCUMENTS

| | | | |
|---|---|---|---|
| 5,973,374 A | 10/1999 | Longcor | |
| 6,436,747 B1 * | 8/2002 | Segawa | H01L 21/26513 |
| | | | 438/197 |

(Continued)

OTHER PUBLICATIONS

Merriam-Webster webpage definition of "adjoin" at (http://www.merriam-webster.com/dictionary/adjoin) on Nov. 30, 2016.*

*Primary Examiner* — Jay C Chang
(74) *Attorney, Agent, or Firm* — Maschoff Brennan

(57) ABSTRACT

A semiconductor device includes a semiconductor substrate, trench isolations, a sacrificial layer, a first resist protect oxide (RPO) layer, a second RPO layer and a silicide layer. The semiconductor substrate has first portions and second portions which are alternately disposed, and each of the second portions includes a first resist region with a first resistance, a second resist region with a second resistance and a silicide region. The second resistance is greater than the first resistance. The trench isolations are in the first portions. The sacrificial layer is on the first resist region. The first RPO layer is on the sacrificial layer. The first RPO layer together with the sacrificial layer have a first thickness. The second RPO layer is on the second resist region, in which the second RPO layer has a second thickness smaller than the first thickness. The silicide layer is on the silicide region.

12 Claims, 16 Drawing Sheets

(56) References Cited

U.S. PATENT DOCUMENTS

| | | | |
|---|---|---|---|
| 2001/0049166 A1* | 12/2001 | Peschiaroli | H01L 27/11526 438/202 |
| 2003/0045062 A1 | 3/2003 | Puchner | |
| 2004/0262646 A1 | 12/2004 | Patrick et al. | |
| 2005/0048708 A1* | 3/2005 | Yamada | H01L 21/28035 438/197 |
| 2006/0131649 A1* | 6/2006 | Krautbauer | H01L 29/36 257/347 |
| 2006/0234439 A1 | 10/2006 | Howard et al. | |
| 2007/0134854 A1* | 6/2007 | Zhang | H01L 21/82285 438/142 |
| 2008/0076242 A1* | 3/2008 | Choi | H01L 27/11526 438/588 |
| 2008/0145985 A1* | 6/2008 | Chi | B82Y 10/00 438/199 |
| 2008/0157165 A1 | 7/2008 | Park | |
| 2009/0014712 A1* | 1/2009 | Suzuki | H01S 5/18308 257/13 |
| 2009/0097315 A1* | 4/2009 | Yun | G11C 11/50 365/185.13 |
| 2010/0289047 A1 | 11/2010 | Kawaguchi et al. | |
| 2011/0095348 A1* | 4/2011 | Chakihara | H01L 21/28273 257/298 |
| 2011/0115019 A1* | 5/2011 | Giles | H01L 29/0653 257/341 |
| 2011/0248396 A1* | 10/2011 | Liu | H01L 25/0657 257/686 |
| 2012/0126285 A1* | 5/2012 | Campi, Jr. | H01L 21/82389 257/173 |
| 2012/0280311 A1 | 11/2012 | Zhang et al. | |

\* cited by examiner

US 10,629,593 B2

FORMATION OF SEMICONDUCTOR DEVICE WITH RESISTORS HAVING DIFFERENT RESISTANCES

CROSS-REFERENCE TO RELATED APPLICATIONS

This application is a divisional application of U.S. Non-Provisional application Ser. No. 14/091,643, filed Nov. 27, 2013, which is incorporated herein by reference in its entirety.

BACKGROUND

In semiconductor fabrication, various layers of insulating material, semiconducting material and conducting material are formed to produce a semiconductor device. The layers are patterned to create features that taken together, form elements such as transistors, capacitors, and resistors. These elements are then interconnected to achieve a desired electrical function, thereby producing an integrated circuit (IC) device. In a conventional process, the resistors are formed by doping or implanting doping ions with a relatively small doping concentration into a substrate. The doping concentration often varies according to different resistances of the resistors. Therefore, the resistors with different resistances have to be formed respectively by the aforementioned doping or implanting processes using different doping concentrations. Further, the operation of forming the resistors cannot be performed by combining with other processes. For example, a source/drain (or a gate) may be formed using an implanting process. However, a doping concentration of the doping ions used to form the source/drain (or the gate) is greater than that used to form the resistors due to consideration of the source/drain (or the gate) with a relatively high conductivity. Thus, the process of fabricating the semiconductor device with resistors is complicated and has high fabrication cost.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

Figure 1A:
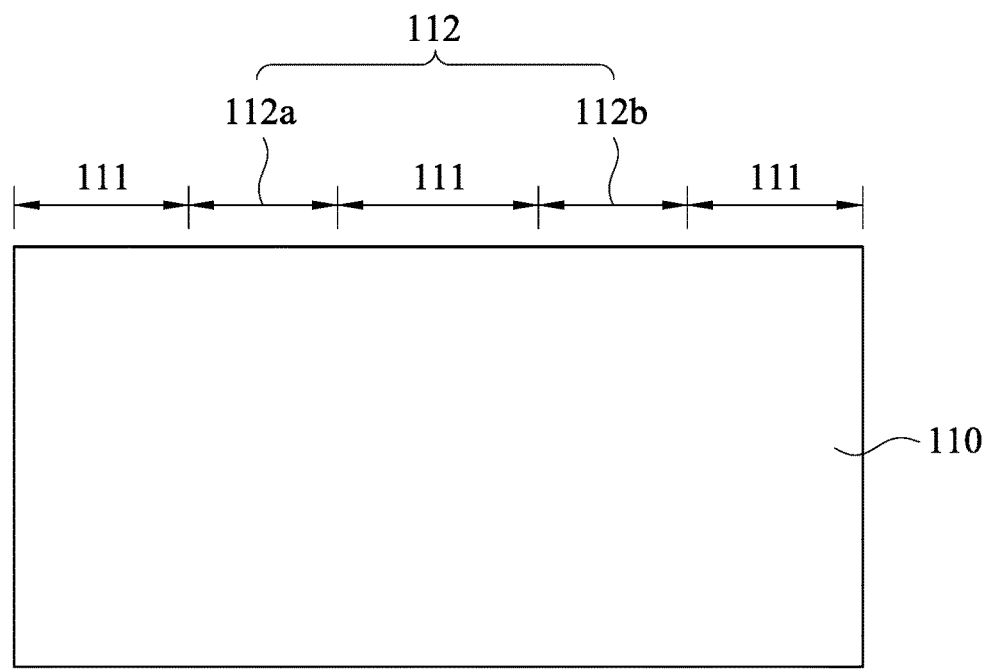
FIG. 1A-1F are schematic cross-sectional views of intermediate stages showing a method for fabricating a semiconductor device in accordance with some embodiments.

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments. The present disclosure may repeat reference numerals and/or letters in the various examples. This repetition is for the purpose of simplicity and clarity and does not in itself dictate a relationship between the various embodiments and/or configurations discussed.

Embodiments of the present disclosure provide a method for fabricating a semiconductor device with resistors. The method includes providing a semiconductor substrate with first portions and second portions, in which trench isolations are formed in the first portions, and each of the second portions includes a first resist region and a second resist region. A first sacrificial layer and a second sacrificial layer are respectively formed on the first resist region and on the second resist region, and then doping ions (such as boron, phosphor, carbon or arsenic) are implanted into the second portions. Thereafter, the second sacrificial layer is removed from the second resist region, and the semiconductor substrate is annealed to homogenize the doping ions in the first resist region and the second resist region, in which a portion of the doping ions are diffused out of the second resist region because the second sacrificial layer is removed. Therefore, a resistance of the second resist region is higher than that of the first resist region. Namely, two kinds of resistors of different resistances can be fabricated at the same time. In some embodiments, the resistance of the second resist region is controlled using a predetermined annealing temperature for a predetermined annealing time.

According to various embodiments of the present disclosure, a method for fabricating a semiconductor device with resistors includes providing a semiconductor substrate with first portions and second portions, in which trench isolations are formed in the first portions and the second portions include a first resist region, a second resist region and a silicide region. A first sacrificial layer, a second sacrificial layer and a third sacrificial layer are respectively formed on the first resist region, the second resist region and the silicide region, and then doping ions (such as boron, phosphor, carbon or arsenic) are implanted into the second portions. Thereafter, the second sacrificial layer is removed from the second resist region, and the semiconductor substrate is annealed to homogenize the doping ions in the first resist region, the second resist region and the silicide region, in which a portion of the doping ions are diffused out of the second resist region because the second sacrificial layer is removed. Then, the third sacrificial layer is removed, and a first resist protect oxide layer and a second resist protect oxide layer are respectively formed on the first sacrificial layer and on the second resist region. The first resist protect oxide layer and the second resist protect oxide layer are used as silicide block layers to prevent the first resist region and the second resist region from forming silicide layers thereon. Thereafter, a silicide layer is formed on the silicide region using such as a self-aligned silicide (salicide) process. Therefore, the process of forming the resistors not only can form resistors of different resistances at the same time, but also may be combined with the process of forming a source/drain (or a gate) with a silicide layer (or referred to as a silicide cap). Accordingly, embodiments of the present disclosure may at least achieve the purpose of reducing cost of fabricating the semiconductor device.

FIG. 1A-1F are schematic cross-sectional views of intermediate stages showing a method for fabricating a semiconductor device in accordance with some embodiments. As shown in FIG. 1A, a semiconductor substrate 110 is provided. The semiconductor substrate 110 has first portions 111 and second portions 112 which are alternately disposed, i.e. two adjacent second portions 212 are separated by one first portion 111. Each of the second portions 112 includes a first resist region 112a and a second resist region 112b. In some embodiments, the semiconductor substrate 110 is formed from such as silicon. Other commonly used materials, such as carbon, germanium, silicon-germanium, gallium, arsenic, nitrogen, indium, phosphorus, and/or the like, may also be included in the semiconductor substrate. The semiconductor substrate 110 may be formed from a single-crystalline semiconductor material or compound semiconductor materials, and may be a bulk substrate or a semiconductor-on-insulator (SOI) substrate.

Figure 1B:
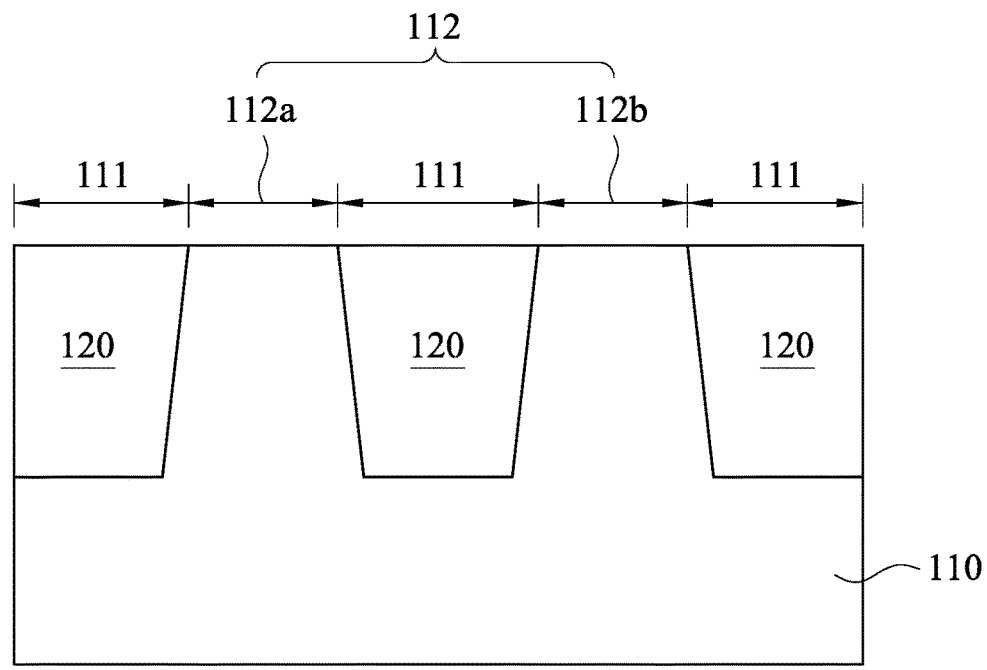

As shown in FIG. 1B, the trench isolations 120 are disposed in the first portions 111 of the semiconductor substrate 110 for isolating the second portions 112. In some embodiments, the trench isolations 120 may be shallow trench isolations (STIs) used to separate and isolate photo diodes, memory cells or SRAM cells in an array area, and some trench isolations 120 are deep trench isolations used to separate and isolate NMOS and PMOS devices in a peripheral area. The structures, materials, depth of the STI and the deep or shallow trench isolation in different area can be different. Specific STI profile and material may be needed for certain device requirements.

Figure 1C:
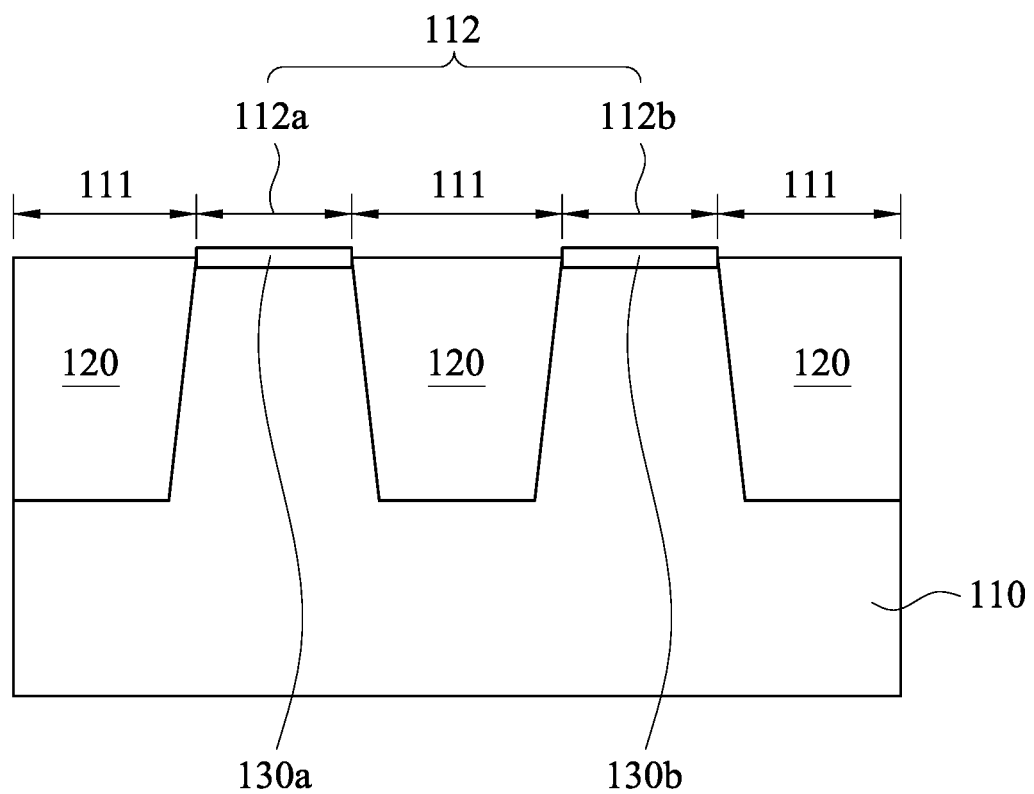

As shown in FIG. 1C, a first sacrificial layer 130a and a second sacrificial layer 130b are formed respectively on the first resist region 112a and on the second resist region 112b. In some embodiments, the first sacrificial layer 130a and the second sacrificial layer 130b are formed using chemical vapor deposition (CVD), a plasma enhanced chemical vapor deposition (PECVD) or low pressure chemical vapor deposition (LPCVD). In other embodiments, the first sacrificial layer 130a and the second sacrificial layer 130b are formed in a gaseous environment containing oxygen at a temperature between about 400° C. to 800° C.

Figure 1D:
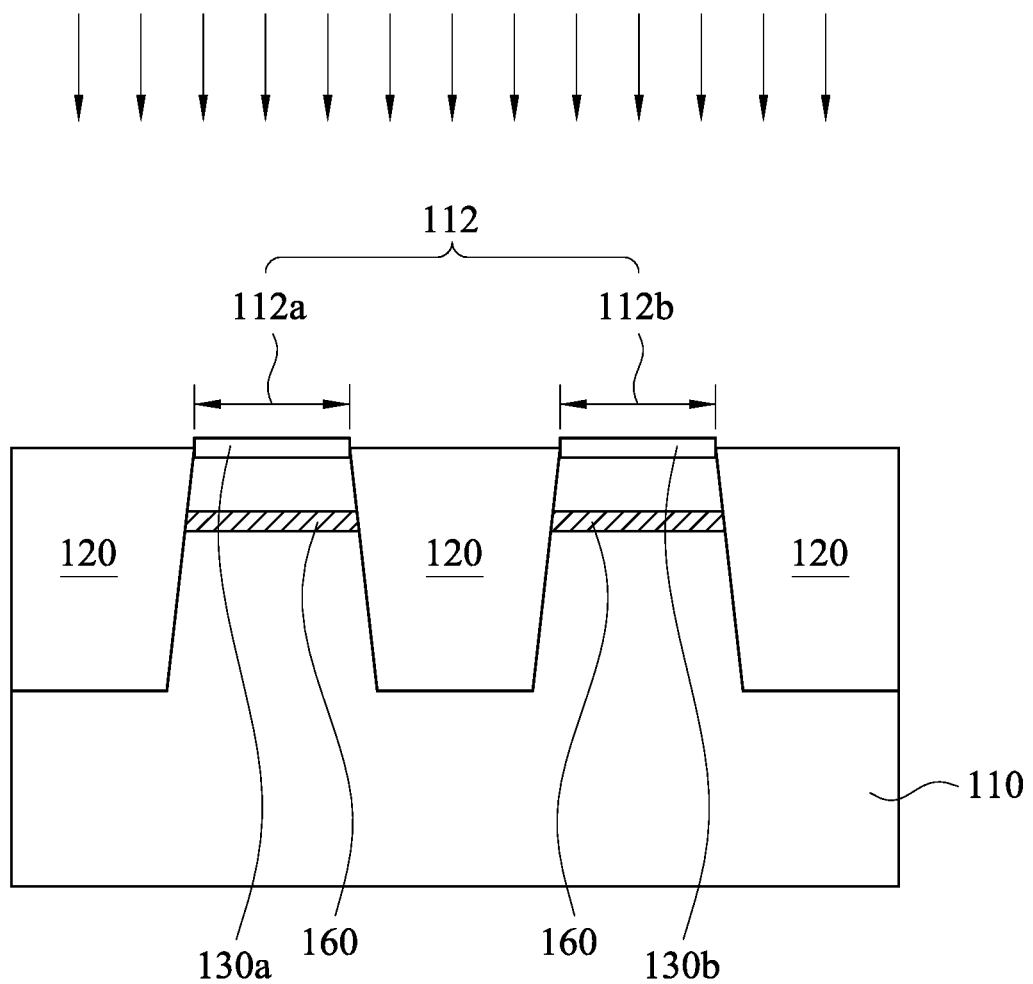

As shown in FIG. 1D, doping ions 160, including such as boron, phosphor, carbon or arsenic, are implanted into the second portions 112 of the semiconductor substrate 110. The first sacrificial layer 130a and the second sacrificial layer 130b may be performed as screen oxides to protect the semiconductor substrate 110 from being damaged during the operation of implanting the doping ions 160. In some embodiments, the operation of implanting the doping ions is performed at a doping concentration in a range from about $10^{14}/cm^3$ to about $10^{16}/cm^3$ and at an energy level between about 20 KeV to 180 KeV or between about 150 KeV to 450 KeV.

Figure 1E:
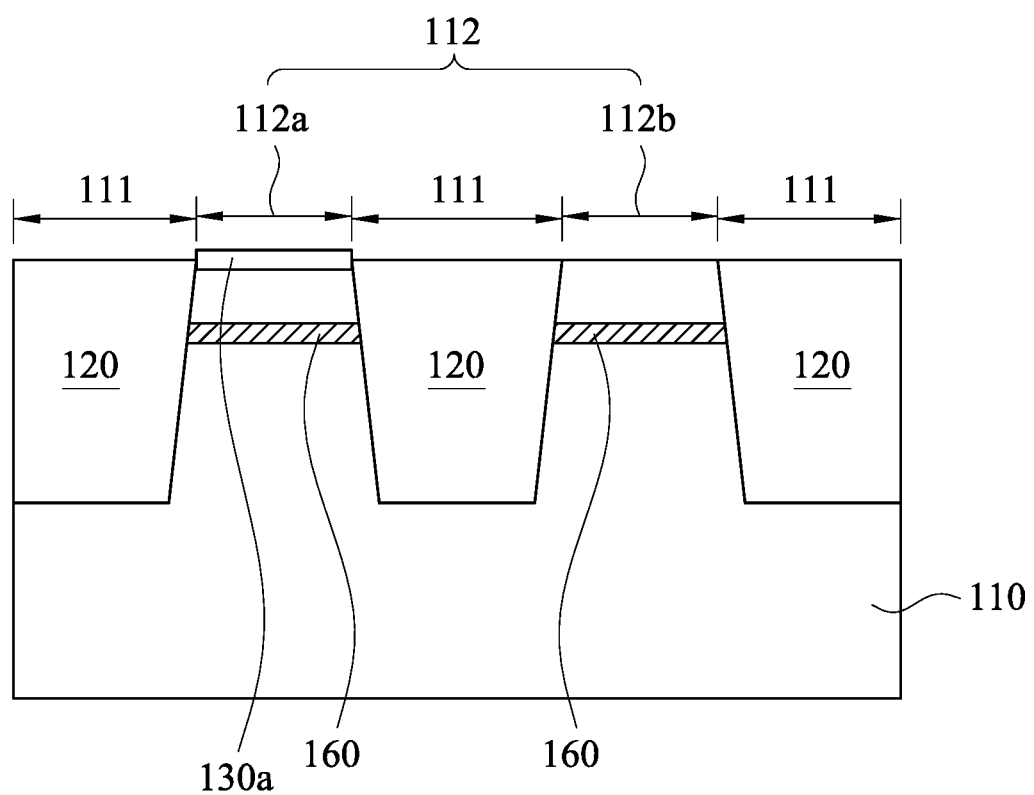

As shown in FIG. 1E, the second sacrificial layer 130b (as shown in FIG. 1D) is removed from the second resist region 112b. In some embodiments, the second sacrificial layer 130b is removed using a hydrofluoric (HF) acid etching operation.

Figure 1F:
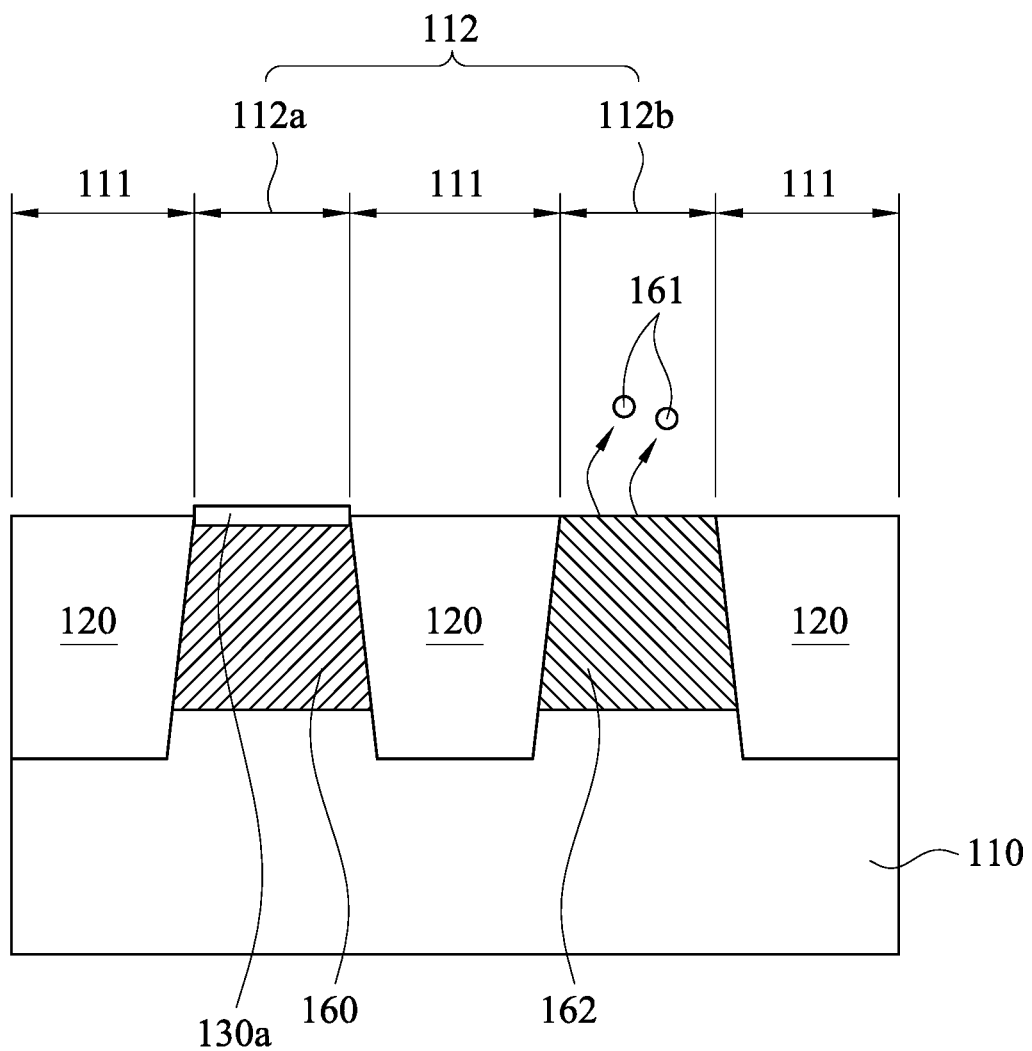

As shown in FIG. 1F, the semiconductor substrate 110 is annealed to homogenize the doping ions 160 in the first resist region 112a and the second resist region 112b. A portion of the doping ions 161 is diffused out of the second resist region 112b because the second sacrificial layer 130b is removed as shown in FIG. 1E. In some embodiments, the operation of annealing the semiconductor substrate 110 includes annealing the semiconductor substrate 110 using an annealing temperature in a range from about 700° C. to about 1200° C. for a period of annealing time greater than about 0 and smaller than or equal to about 1 hour. In alternative embodiments, the operation of annealing the semiconductor substrate 110 includes annealing the semiconductor substrate 110 using a rapid thermal annealing (RTA) process.

In some embodiments, the first resist region 112a and the second resist region 112b are implanted with a doping concentration of about $10^{14}$ to about $10^{16}/cm^3$, as shown in FIG. 1D. After the annealing operation, the first resist region 112a has a homogeneous doping concentration similar to the doping concentration used at the operation of implanting the doping ions 160. Namely, the doping ions 160 in the first resist region 112a are kept in the first resist region 112a by the first sacrificial layer 130a. On the contrary, the aforementioned portion of the doping ions 161 (as shown in FIG. 1F) in the second resist region 112b is diffused out of the second resist region 112b. In some embodiments, a remaining doping concentration of the doping ions 162 (as shown in FIG. 1F) of the second resist region 112b is substantially in a range from $10^{11}/cm^3$ to $10^{14}/cm^3$. In general, a portion of the semiconductor substrate 110 with a relatively small doping concentration has a relatively high resistance. Therefore, the second resist region 112b has a higher resistance than the first resist region 112a. Namely, two kinds of resistors of different resistances can be fabricated at the same time. In some embodiments, the annealing temperature and the annealing time may vary according to the different resistances requirements. In some embodiments, the resistance of the second resist region 112b is increased under a higher annealing temperature and a longer annealing time.

Figure 2A:
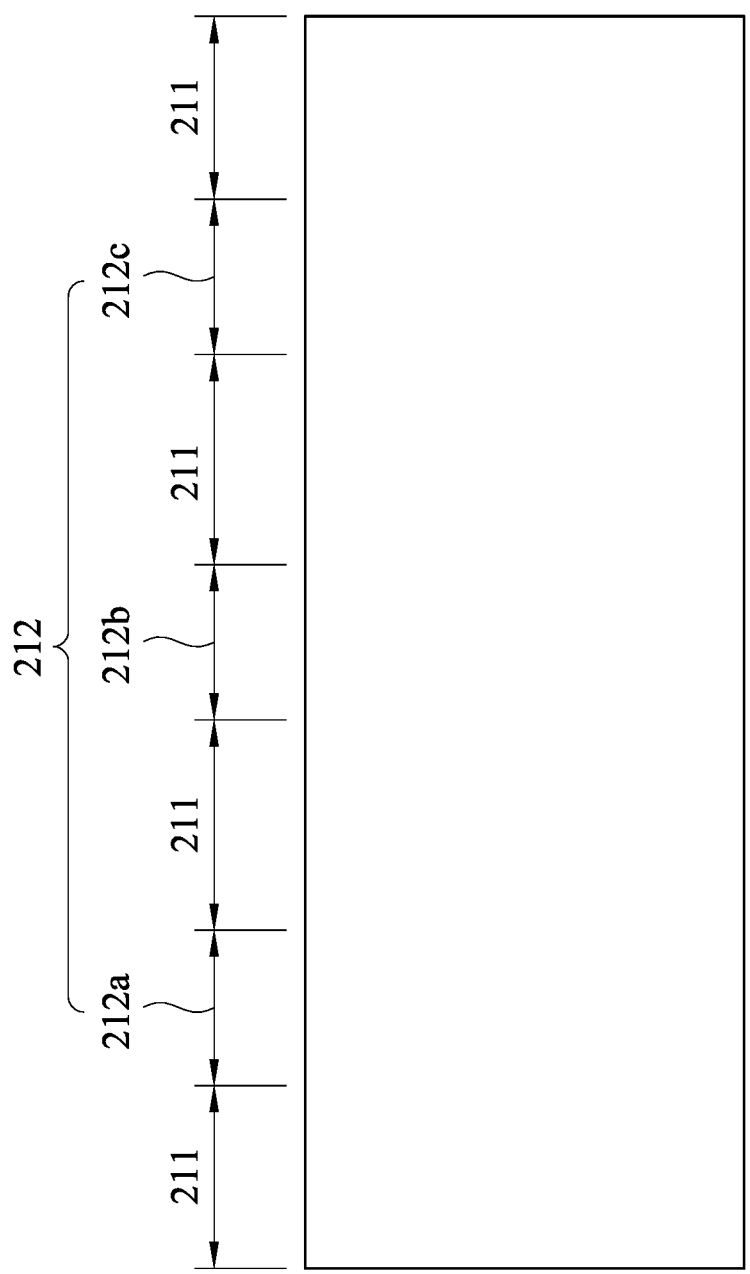
FIG. 2A-2I are schematic cross-sectional views of intermediate stages showing a method for fabricating a semiconductor device in accordance with certain embodiments.

FIG. 2A-2I are schematic cross-sectional views of intermediate stages showing a method for fabricating a semiconductor device in accordance with certain embodiments. As shown in FIG. 2A, a semiconductor substrate 210 is provided. The semiconductor substrate 210 has first portions 211 and second portions 212 which are alternately disposed, i.e. two adjacent second portions 212 are separated by one first portion 211. Each of the second portions 212 includes a first resist region 212a, a second resist region 212b and a silicide region 212c. In some embodiments, the semiconductor substrate 210 may be formed from a material similar to the semiconductor substrate 110 described above, and thus is not repeated again.

Figure 2B:
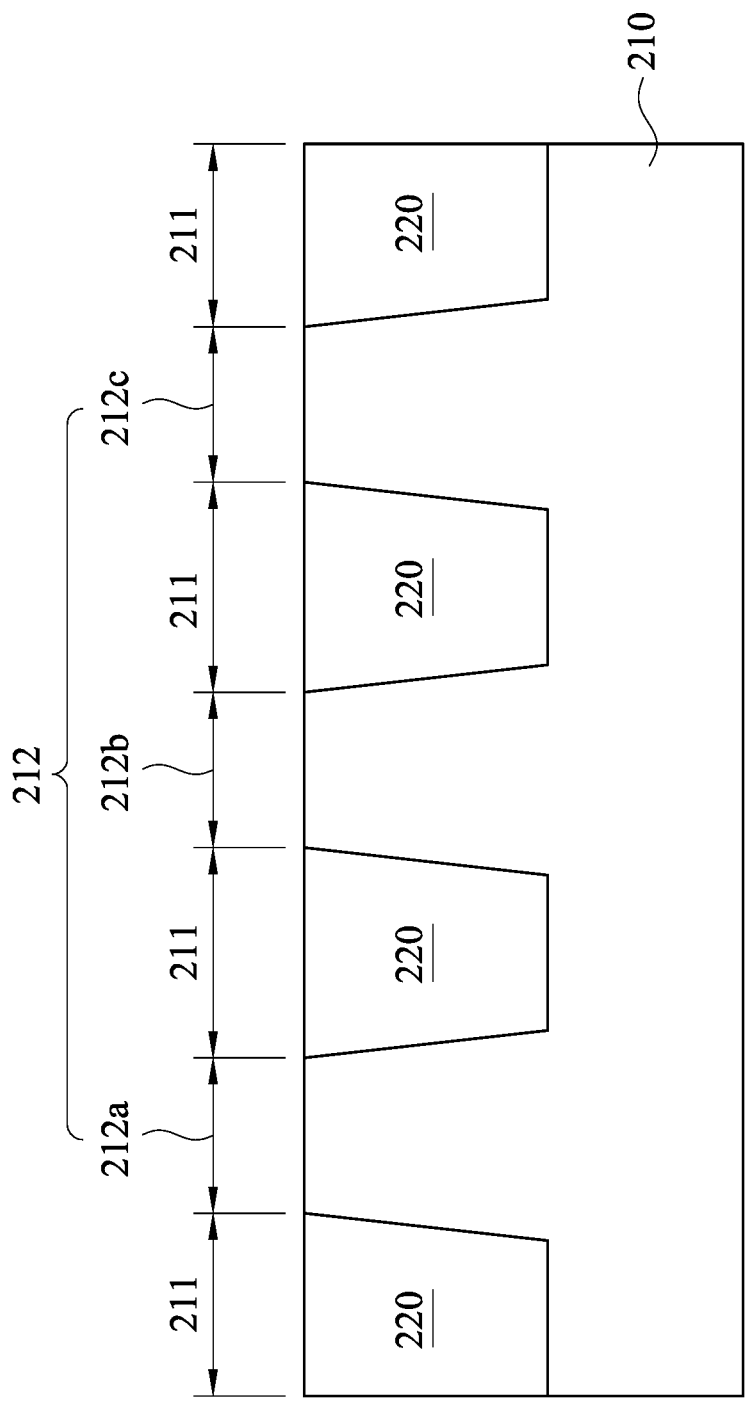
Figure 2C:
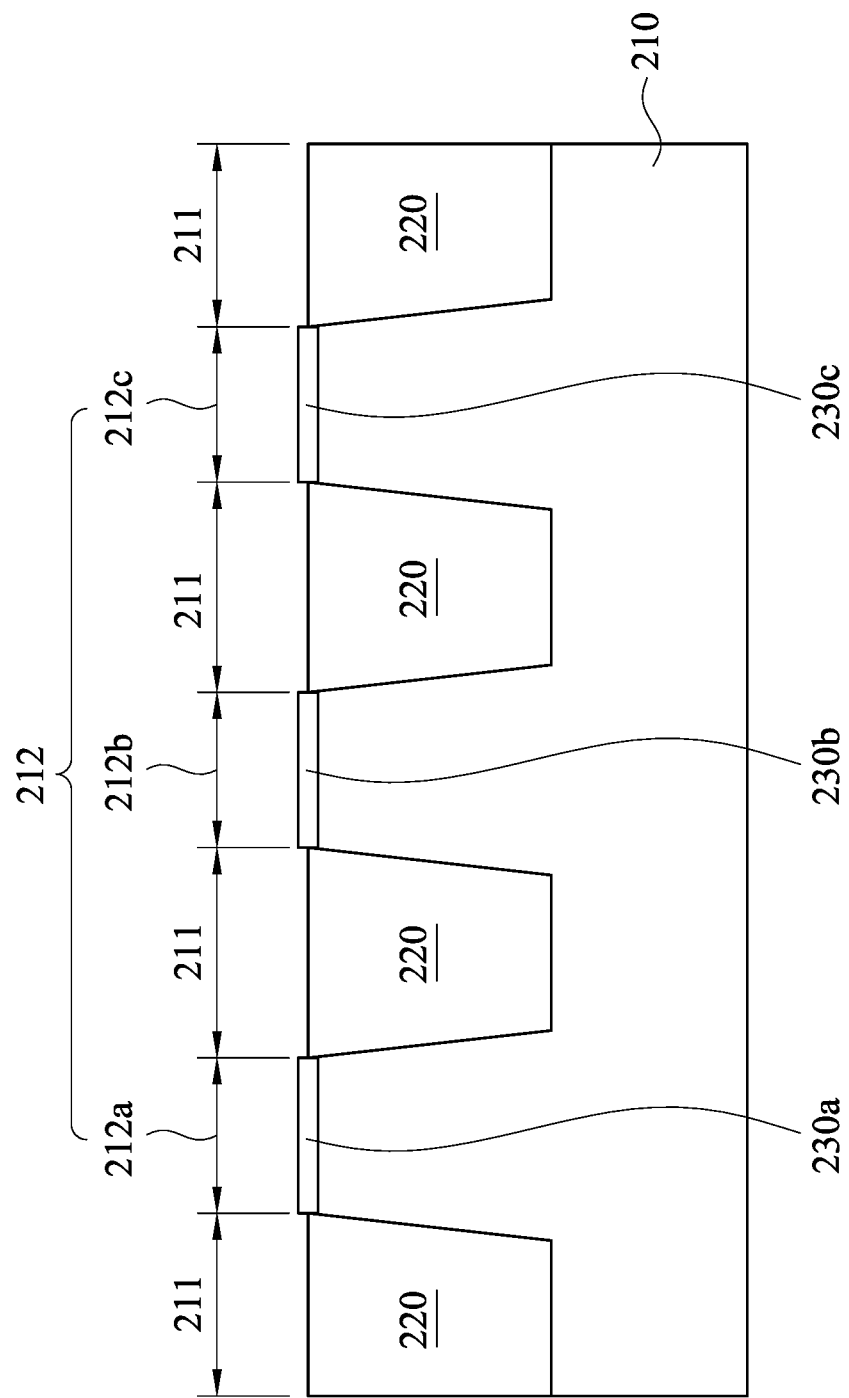

As shown in FIG. 2B, the trench isolations 220 are disposed in the first portions 211 of the semiconductor substrate 210 for isolating the second portions 212. As shown in FIG. 2C, a first sacrificial layer 230a, a second sacrificial layer 230b and a third sacrificial layer 230c are formed respectively on the first resist region 212a, the second resist region 212b and the silicide region 212c. In some embodiments, the first sacrificial layer 230a, the second sacrificial layer 230b and the third sacrificial layer 230c are formed using CVD, PECVD or LPCVD. In certain embodiments, the first sacrificial layer 230a, the second sacrificial layer 230b and the third sacrificial layer 230c are formed in a gaseous environment containing oxygen at a temperature between about 400° C. to about 800° C.

Figure 2D:
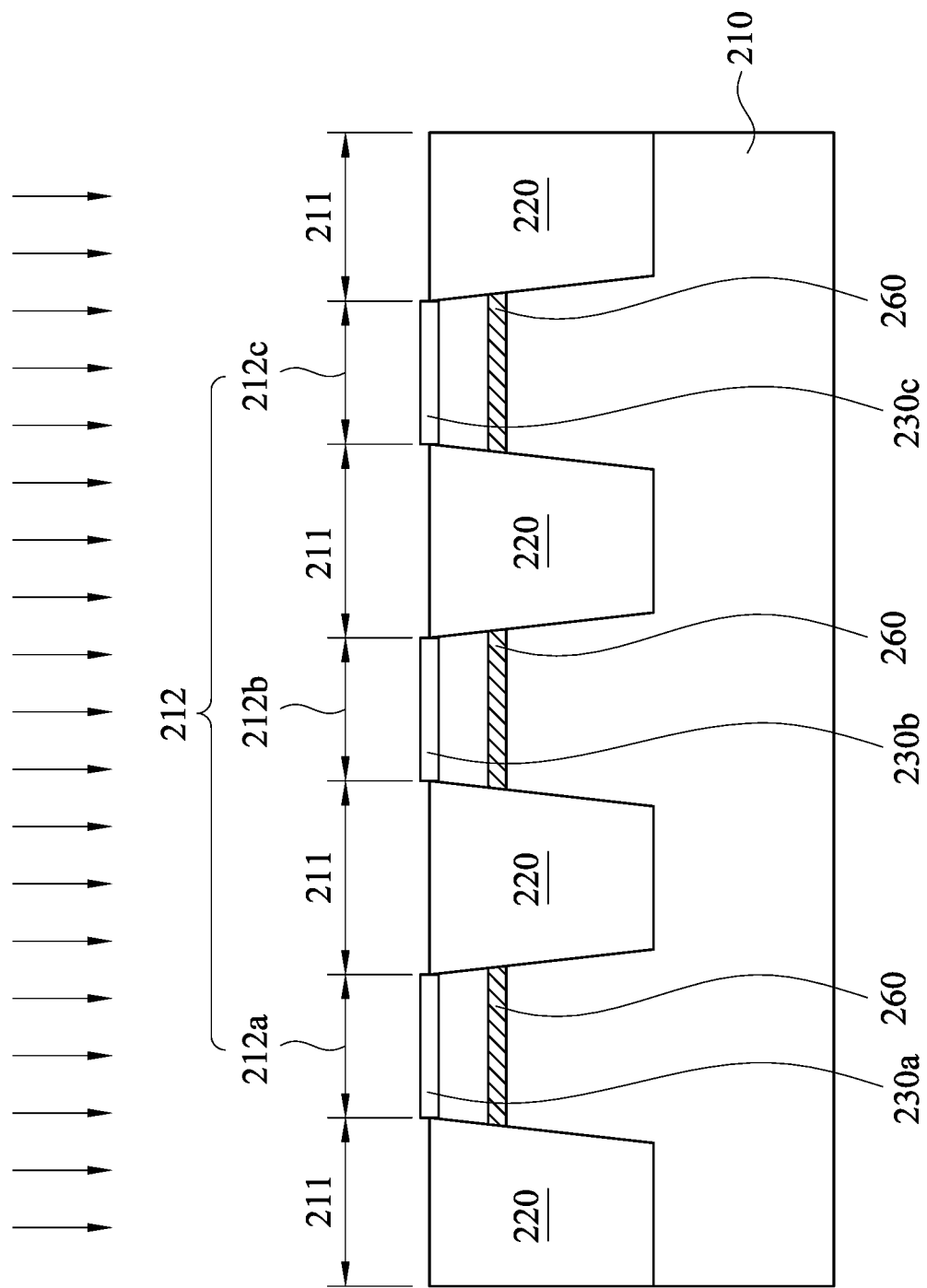

As shown in FIG. 2D, doping ions 260 including, such as boron, phosphor, carbon or arsenic, are implanted into the second portions 212 of the semiconductor substrate 210. The first sacrificial layer 230a, the second sacrificial layer 230b and the third sacrificial layer 230c may be performed as screen oxides to protect the semiconductor substrate 210 from being damaged during the operation of implanting the doping ions 260. In some embodiments, the operation of implanting the doping ions 260 is performed at a doping concentration in a range from about $10^{14}/cm^3$ to about $10^{16}/cm^3$ and at an energy level between about 20 KeV to 180 KeV or between about 150 KeV to 450 KeV.

Figure 2E:
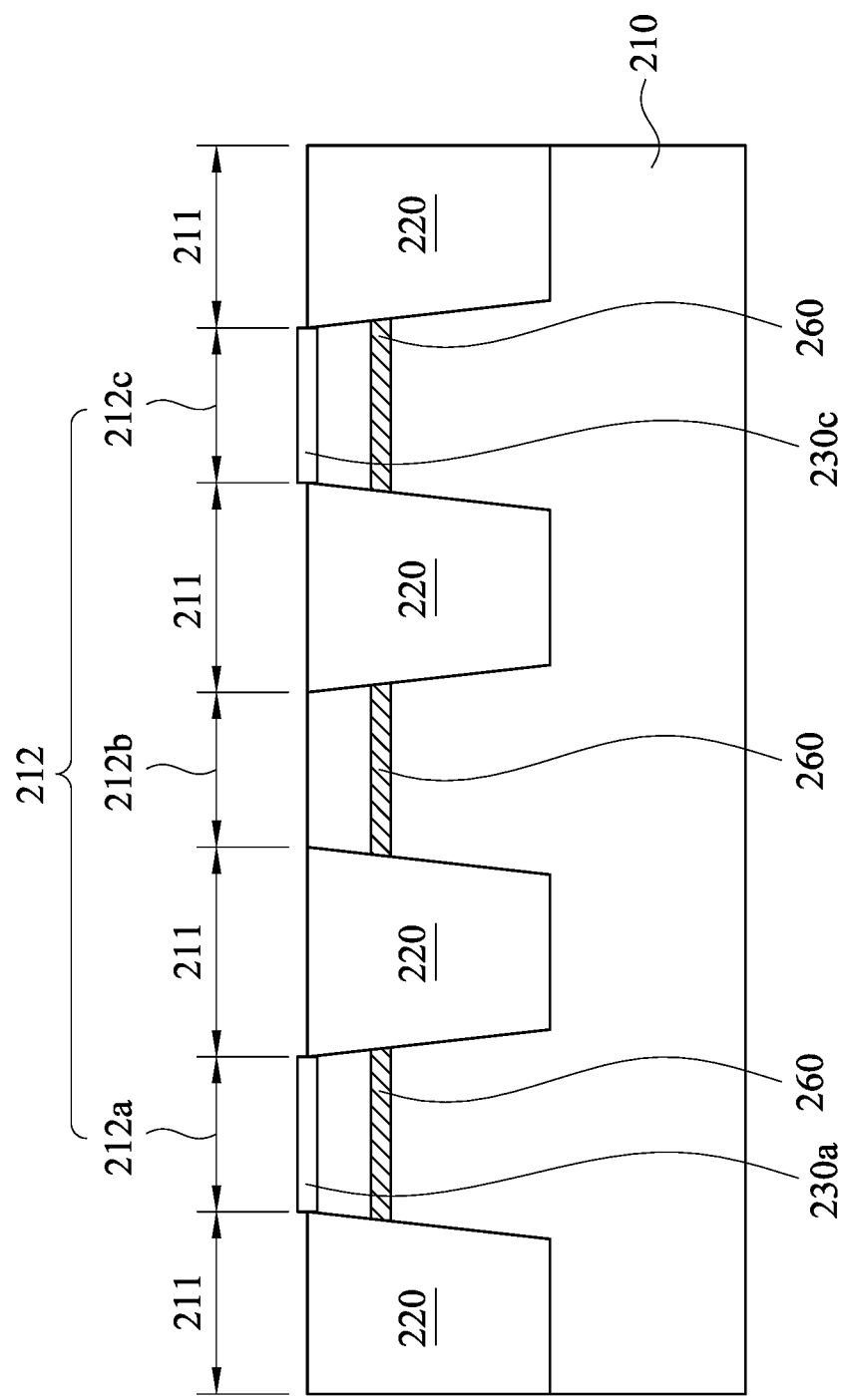

As shown in FIG. 2E, the second sacrificial layer 230b, (as shown in FIG. 2D) is removed from the second resist region 212b. In some embodiments, the second sacrificial layer 230b is removed using a HF acid etching operation.

Figure 2F:
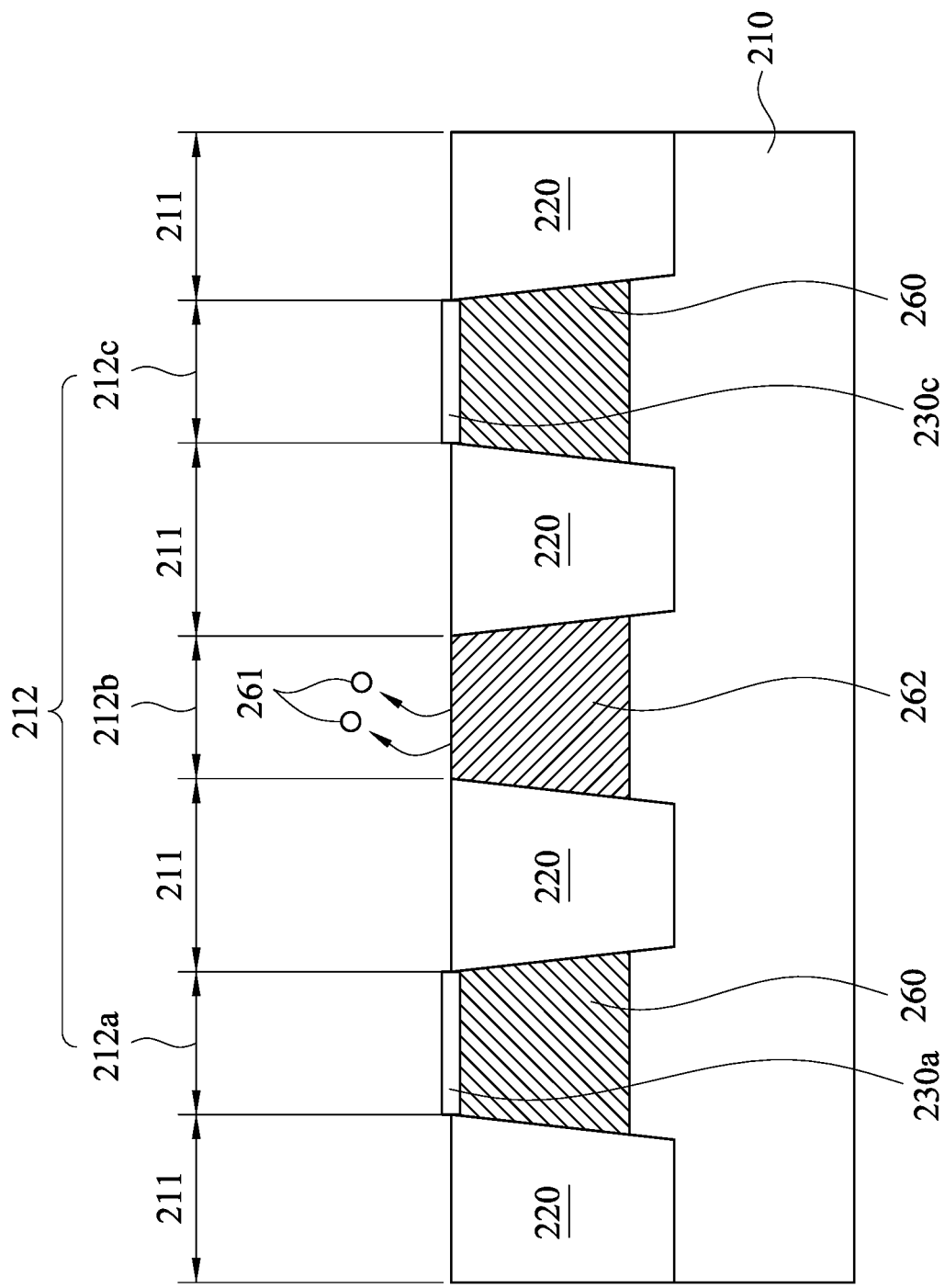

As shown in FIG. 2F, the semiconductor substrate 210 is annealed to homogenize the doping ions 260 in the first resist region 212a, the second resist region 212b and the silicide region 212c. A portion of the doping ions 261 is diffused out of the second resist region 212b because the second sacrificial layer 230b is removed as shown in FIG. 2E. In some embodiments, the operation of annealing the semiconductor substrate includes annealing the semiconductor substrate 210 using an annealing temperature in a range from about 700° C. to about 1200° C. for a period of annealing time greater than about 0 and smaller than or equal to about 1 hour. In alternative embodiments, the operation of annealing the semiconductor substrate 210 includes annealing the semiconductor substrate 210 using a RTA process.

In some embodiments, the first resist region 212a, the second resist region 212b and the silicide region 212c are implanted with a doping concentration of about $10^{14}$ to about $10^{16}$/cm$^3$, as shown in FIG. 2D. After the annealing operation, the first resist region 212a has a homogeneous doping concentration similar to the doping concentration used at the operation of implanting the doping ions 260. Namely, the doping ions 260 in the first resist region 212a are kept in the first resist region 212a by the first sacrificial layer 230a. Similarly, the silicide region 212c also has a homogeneous doping concentration similar to the doping concentration used at the operation of implanting the doping ions 260. On the contrary, the aforementioned portion of the doping ions 261 (as shown in FIG. 2F) in the second resist region 212b is diffused out of the second resist region 212b. In some embodiments, a remaining doping concentration of the doping ions 262 (as shown in FIG. 2F) of the second resist region 212b is substantially in a range from $10^{11}$/cm$^3$ to $10^{14}$/cm$^3$. In general, a portion of the semiconductor substrate 210 with a relatively small doping concentration has a relatively high resistance. Therefore, the second resist region 212b has a higher resistance than the first resist region 212a. Namely, two kinds of resistors of different resistances can be fabricated at the same time, in which the first resist region 212a may has a first resistance of about 100 Ohm/sqr to about 400 Ohm/sqr and the second resist region 212b may has a second resistance of about 300 Ohm/sqr to about 3000 Ohm/sqr. In some embodiments, the annealing temperature and the annealing time may vary according to the different resistances requirements. In some embodiments, the resistance of the second resist region 212b is increased under a higher annealing temperature and a longer annealing time.

Figure 2G:
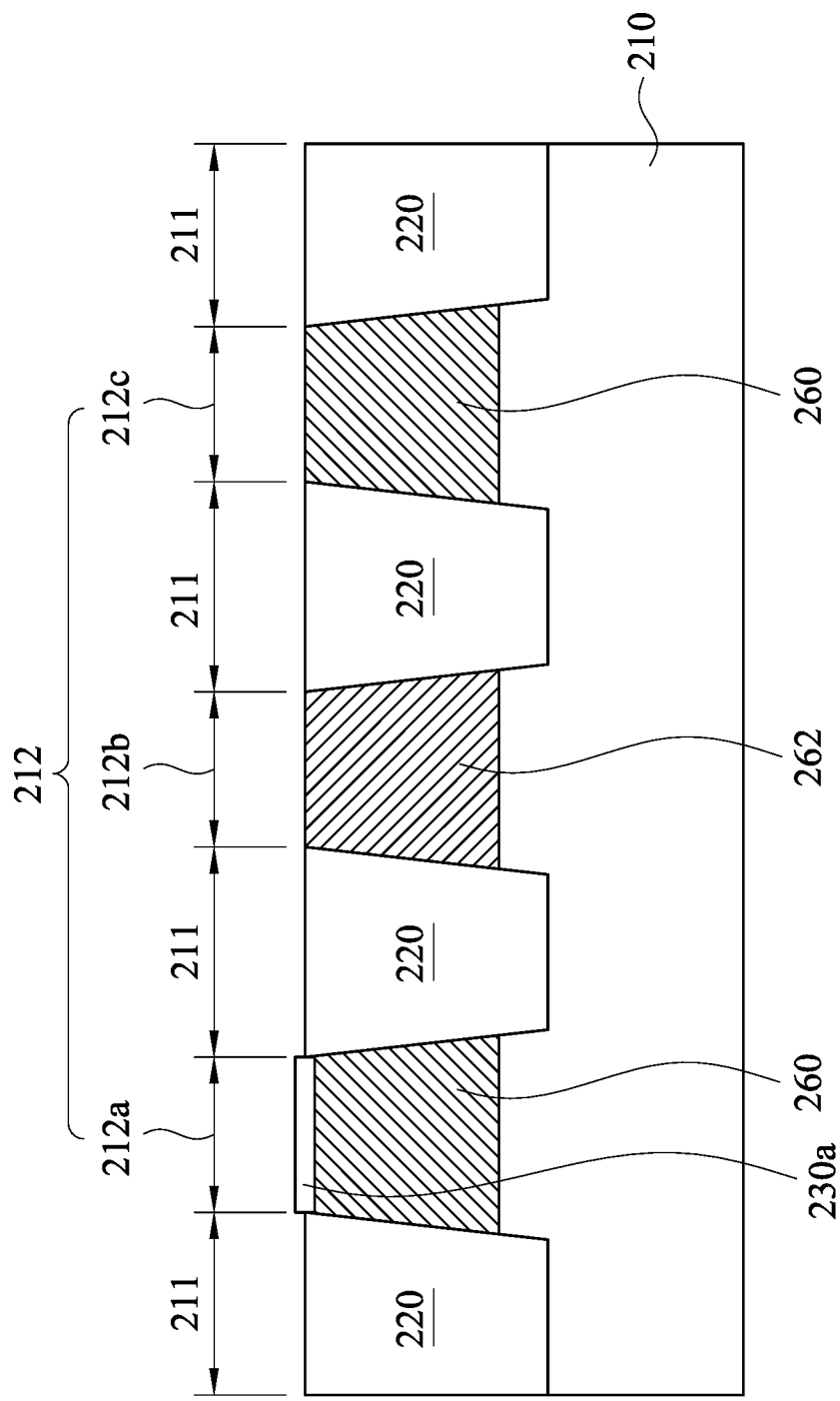

As shown in FIG. 2G, the third sacrificial layer 230c is removed from the silicide region. In some embodiments, the third sacrificial layer 230c is removed using a HF acid etching operation.

Figure 2H:
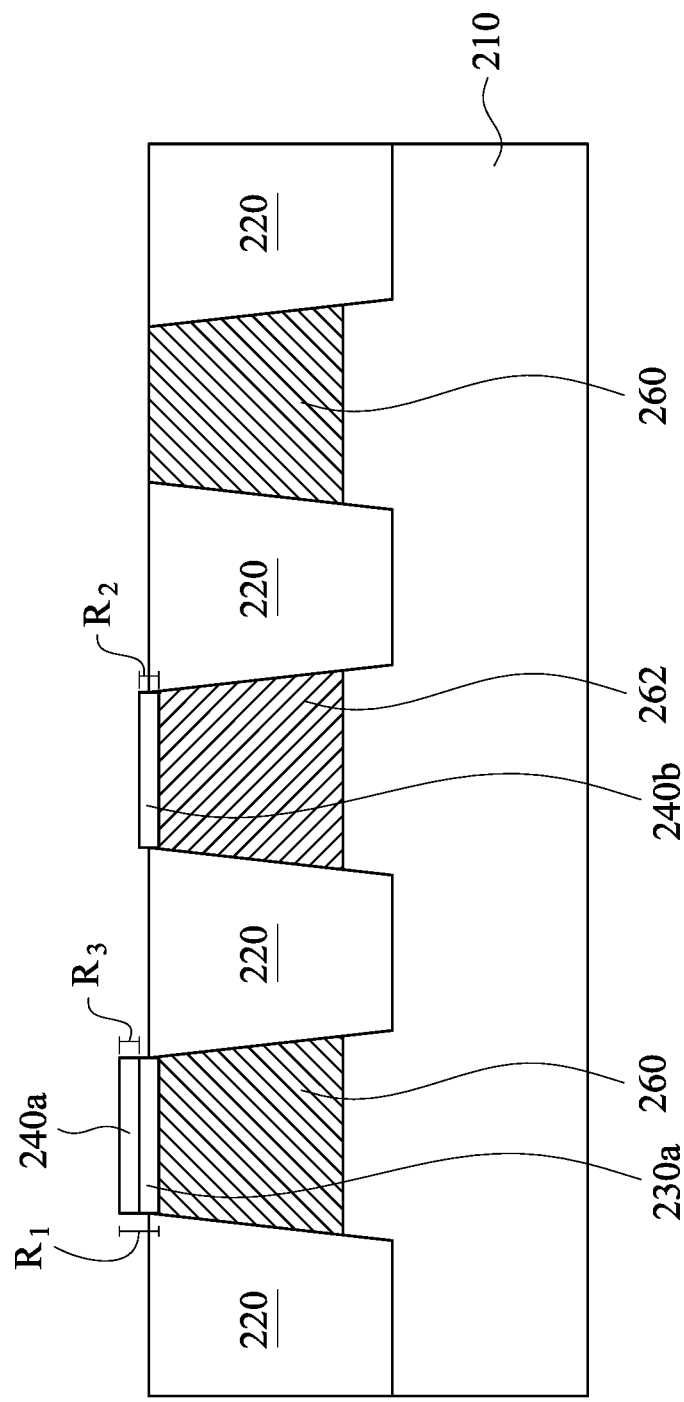

As shown in FIG. 2H, a first resist protect oxide layer 240a and a second resist protect oxide layer 240b are formed respectively on the first sacrificial layer 230a and on the second resist region 212b. In some embodiments, the first resist protect oxide layer 240a and the second resist protect oxide layer 240b are formed using CVD, PECVD or LPCVD. In alternative embodiments, the first resist protect oxide layer 240a and the second resist protect oxide layer 240b may be formed from silicon oxide, silicon oxynitride (SiON), silicon nitride, or a composite thereof.

In some embodiments, the first resist protect oxide layer 240a together with the first sacrificial layer 230a have a first thickness $R_1$, the second resist protect oxide layer 240b has a second thickness $R_2$ and the first resist protect oxide layer 240a itself has a third thickness $R_3$, in which the first thickness $R_1$ is substantially in a range from 10 to 110 nm, and the second thickness $R_2$ is greater than about 0 and smaller than or equal to about 30 nm. In alternative embodiments, the first resist protect oxide layer 240a and the second resist protect oxide layer 240b may be formed at the same operation, such that the first resist protect oxide layer 240a has a third thickness $R_3$ which is the same with the second thickness $R_2$. It is noted that, the first resist protect oxide layer 240a and the first sacrificial layer 230a are formed at different operations but may be formed from the same material or different materials.

Figure 2I:
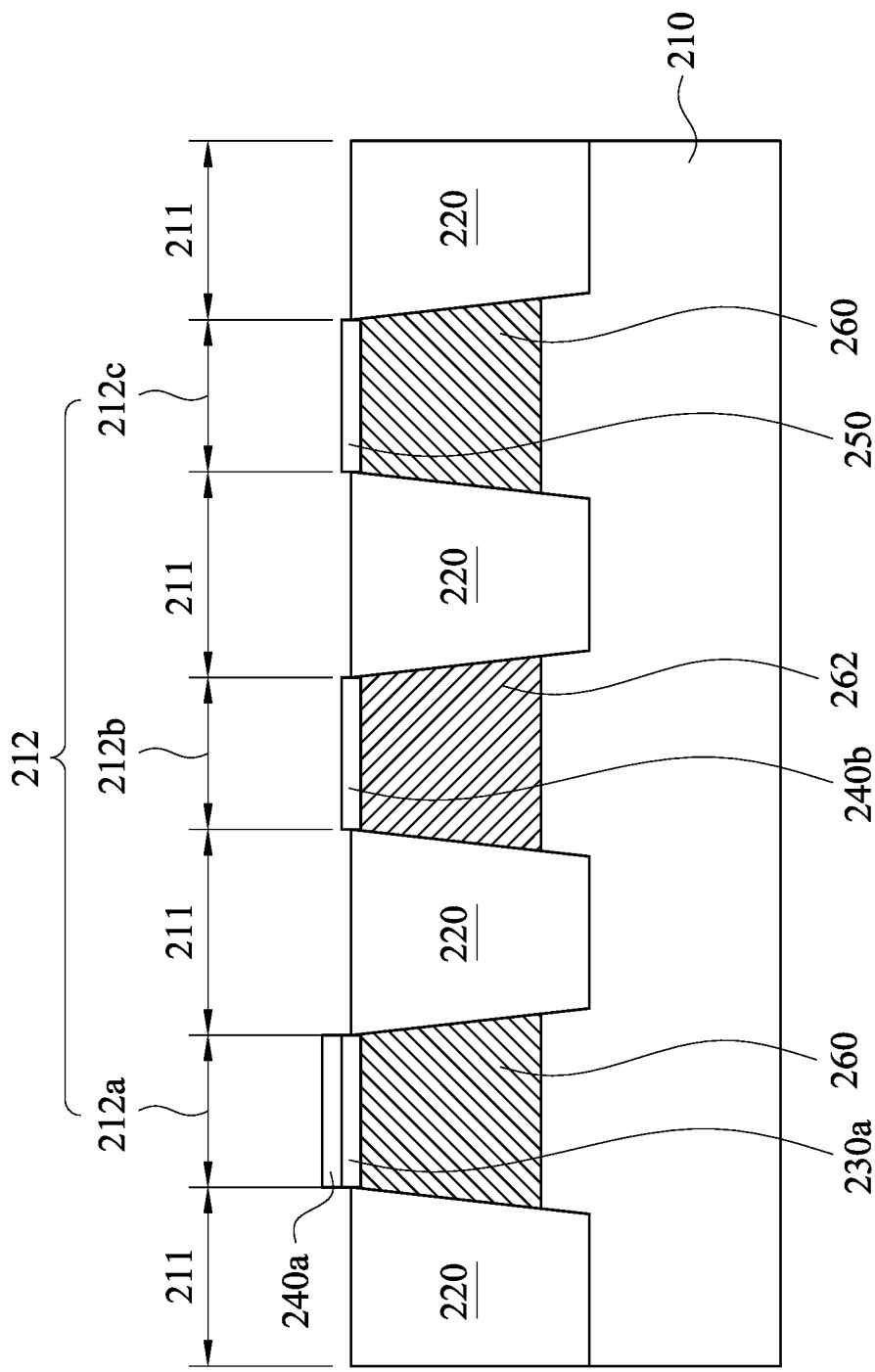

As shown in FIG. 2I, a silicide layer 250 is formed on the silicide region 212c. In detail, the first resist protect oxide layer 240a and the second resist protect oxide layer 240b are used as silicide block layers to prevent the first resist region 212a and the second resist region 212b from forming silicide layers thereon. In some embodiments, the silicide layer 250 may be formed using a self-aligned silicide (salicide) process. In alternative embodiments, the silicide region 212c may have a homogeneous doping concentration similar to that of the first resist region 212a due to the existence of the first sacrificial layer 230a and the third sacrificial layer 230c when the operation of annealing the semiconductor substrate 210 is performed. However, the silicide layer 250 formed on the silicide region 212c decreases the resistance of the silicide region 212c i.e., the conductivity of the silicide region 212c is increased. Therefore, not only two kinds of different resistances of resistors can be fabricated at the same time, but also the process of forming the resistors may be combined with the process of forming a source/drain (or a gate) with the silicide layer 250.

Figure 3:
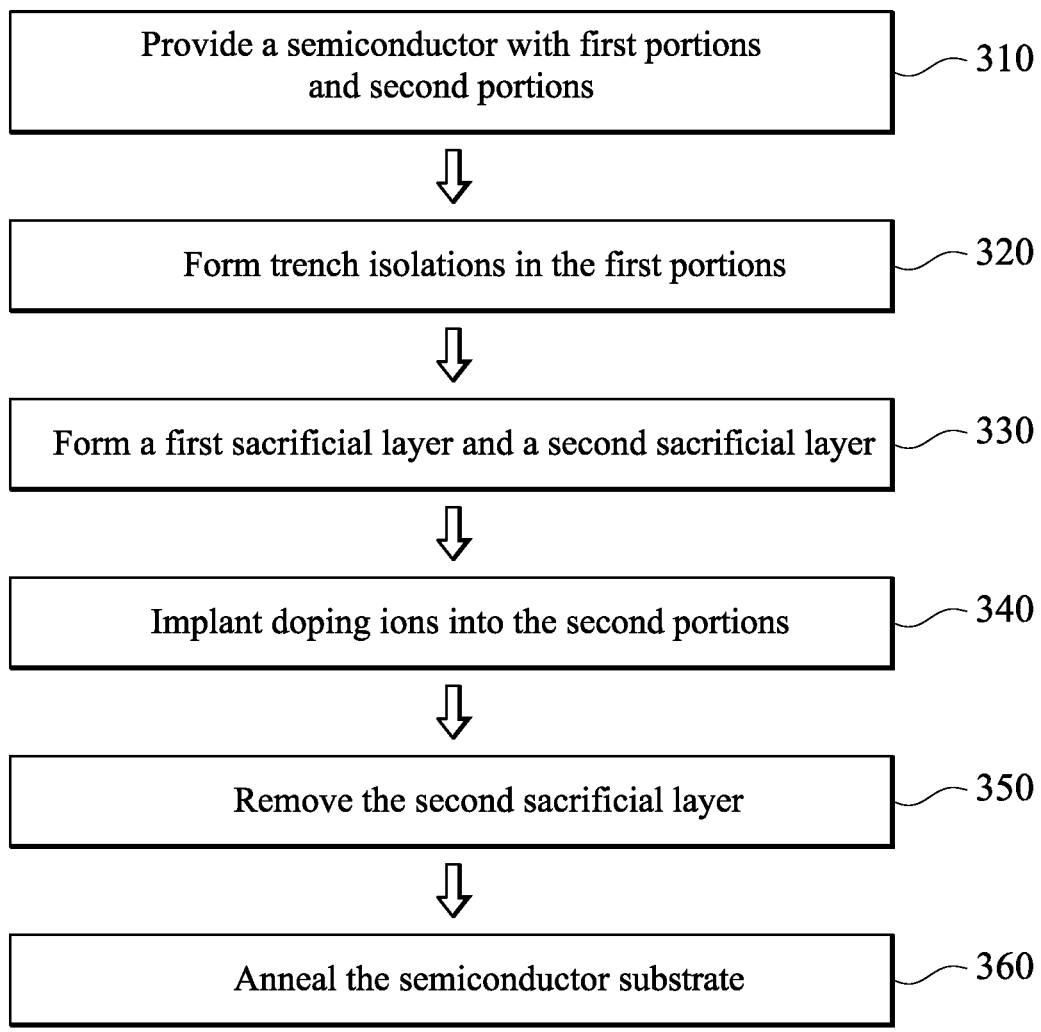
FIG. 3 is a flow chart of a method for fabricating a semiconductor device in accordance with various embodiments.

Referring to FIG. 3 together with FIG. 1A-FIG. 1F, FIG. 3 is a flow chart of a method 300 for fabricating a semiconductor device in accordance with various embodiments. The method 300 begins at operation 310, where a semiconductor substrate 110 with first portions 111 and second portions 112 is provided, as shown in FIG. 1A. The second portions 112 and the first portions 111 are alternately disposed, and each of the second portions 112 includes a first resist region 112a and a second resist region 112b. At operation 320, trench isolations 120 are formed in the first portions 111 of the semiconductor substrate 110, as shown in FIG. 1B. At operation 330, a first sacrificial layer 130a and a second sacrificial layer 130b are respectively formed on the first resist region 112a and on the second resist region 112b, as shown in FIG. 1C. At operation 340, doping ions 160 are implanted into the second portions 112 of the semiconductor substrate 110, as shown in FIG. 1D. At operation 350, the second sacrificial layer 130b is removed from the second resist region 112b, as shown in FIG. 1E. At operation 360, the semiconductor substrate 110 is annealed to homogenize the doping ions in the first resist region 112a and the second resist region 112b, and to diffuse a portion of the doping ions 161 out of the second resist region 112b, thereby having the second resist region 112b with a remaining doping concentration, in which a resistance of the second resist region is greater than that of the first resist region, as shown in FIG. 1F.

Figure 4:
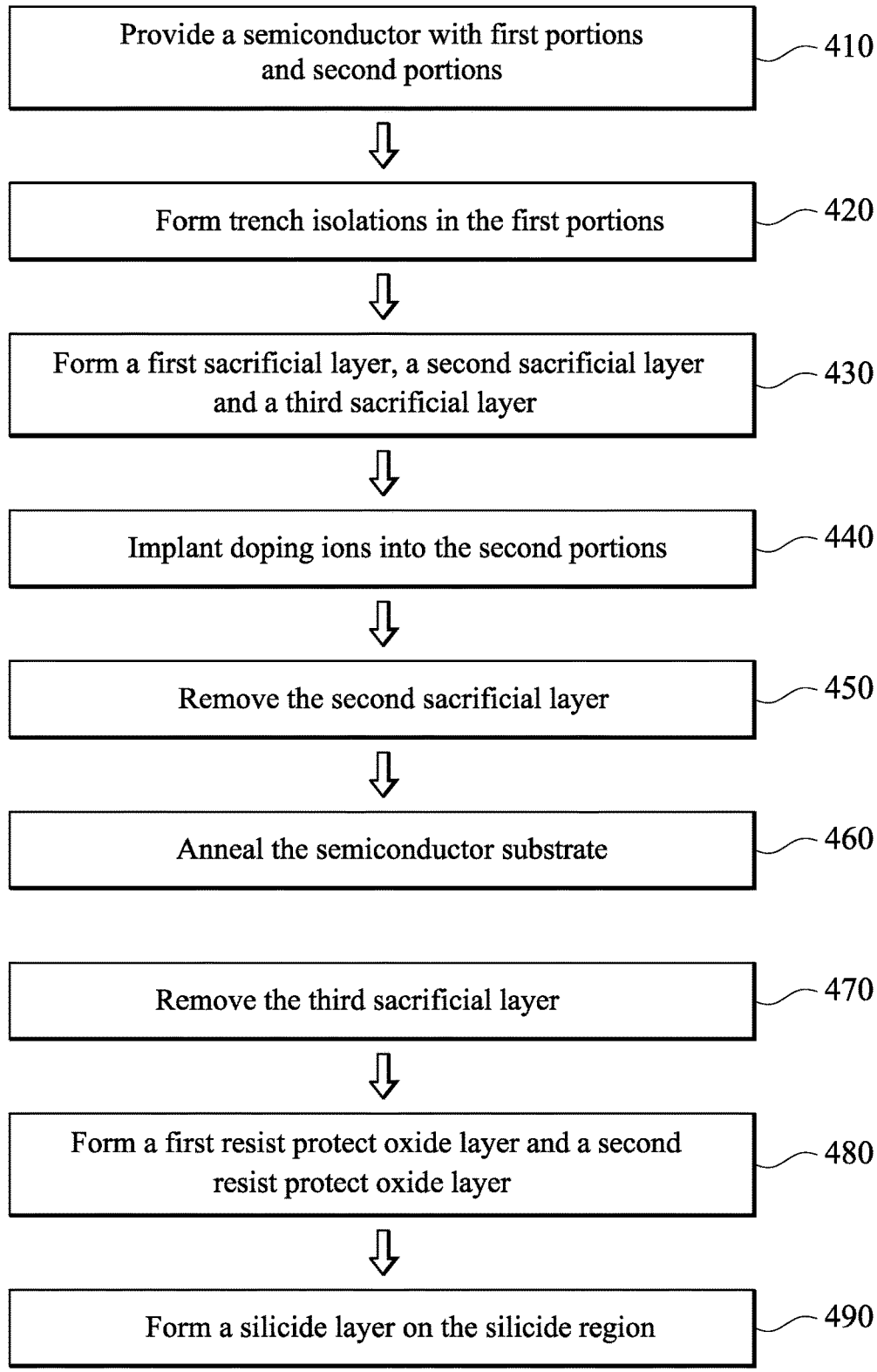
FIG. 4 is a flow chart of a method for fabricating a semiconductor device in accordance with various embodiments.

Referring to FIG. 4 together with FIG. 2A-FIG. 2I, FIG. 4 is a flow chart of a method 400 for fabricating a semiconductor device in accordance with various embodiments. The method 400 begins at operation 410, where a semiconductor substrate 210 with first portions 211 and second portions 212 is provided, as shown in FIG. 2A. The second portions 212 and the first portions 211 are alternately disposed, and the second portions 212 include a first resist region 212a, a second resist region 212b and a silicide region 212c. At operation 420, trench isolations 220 are formed in the first portions 211 of the semiconductor substrate 210, as shown in FIG. 2B. At operation 430, a first sacrificial layer 230a, a second sacrificial layer 230b and a third sacrificial layer 230c are respectively formed on the first resist region 212a, the second resist region 212b and the third resist region 212c, as shown in FIG. 2C. At operation 440, doping ions 260 are implanted into the second portions 212 of the semiconductor substrate 210, as shown in FIG. 2D. At operation 450, the second sacrificial layer 230b is removed from the second resist region 212b, as shown in FIG. 2E. At operation 460, the semiconductor substrate 210 is annealed to homogenize the doping ions 260 in the first resist region 212a, the second resist region 212b and the silicide region 212c, and to diffuse a portion of the doping ions 261 out of the second resist region 212b, thereby having the second resist region 212b with a remaining doping concentration, in which a resistance of the second resist region 212b is greater than that of the first resist region 212a, as shown in FIG. 2F. At operation 470, the third sacrificial layer is removed from the silicide region, as shown in FIG. 2G. At operation 480, a first resist protect oxide layer 240a and a second resist protect oxide layer 240b are respectively formed on the first sacrificial layer 230a and on the second resist region 212b, as shown in FIG. 2H. At operation 490, a silicide layer 250 is formed on the silicide region 212c, as shown in FIG. 2I.

In accordance with some embodiments, the present disclosure discloses a method for fabricating a semiconductor device. In this method, a semiconductor substrate with first portions and second portions are provided. The second portions and the first portions are alternately disposed, in which each of the second portions includes a first resist region and a second resist region. Trench isolations are formed in the first portions of the semiconductor substrate. A first sacrificial layer and a second sacrificial layer are respectively formed on the first resist region and on the second resist region. Doping ions are implanted into the second portions of the semiconductor substrate. The second sacrificial layer is removed from the second resist region. The semiconductor substrate is annealed to homogenize the doping ions in the first resist region and the second resist region, and to diffuse a portion of the doping ions out of the second resist region, thereby having the second resist region with the remaining doping concentration, in which a resistance of the second resist region is greater than that of the first resist region.

In accordance with certain embodiments, the present disclosure discloses a method for fabricating a semiconductor device. In this method, a semiconductor substrate with first portions and second portions are provided. The second portions and the first portions are alternately disposed, in which each of the second portions includes a first resist region, a second resist region and a silicide region. Trench isolations are formed in the first portions of the semiconductor substrate. A first sacrificial layer, a second sacrificial layer and a third sacrificial layer are respectively formed on the first resist region, the second resist region and the silicide region. Doping ions are implanted into the second portions of the semiconductor substrate. The second sacrificial layer is removed from the second resist region. The semiconductor substrate is annealed to homogenize the doping ions in the first resist region, the second resist region and the silicide region, and to diffuse a portion of the doping ions out of the second resist region, thereby having the second resist region with a remaining doping concentration, in which a resistance of the second resist region is greater than that of the first resist region. The third sacrificial layer is removed from the silicide region. A first resist protect oxide layer and a second resist protect oxide layer are formed respectively on the first sacrificial layer and on the second resist region. A silicide layer is formed on the silicide region.

In accordance with alternative embodiments, the present disclosure discloses a semiconductor device including a semiconductor substrate, trench isolations, a sacrificial layer, a first resist protect oxide layer, a second resist protect oxide layer and a silicide layer. The semiconductor substrate has first portions and second portions which are alternately disposed, and each of the second portions includes a first resist region with a first resistance, a second resist region with a second resistance and a silicide region. The second resistance is greater than the first resistance. The trench isolations are in the first portions. The sacrificial layer is on the first resist region. The first resist protect oxide layer is on the sacrificial layer, in which the first resist protect oxide layer together with the sacrificial layer have a first thickness. The second resist protect oxide layer is on the second resist region, in which the second resist protect oxide layer has a second thickness smaller than the first thickness. The silicide layer is on the silicide region.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   a semiconductor substrate with a plurality of first portions, a first resistance region with a first resistance, a second resistance region with a second resistance, and a silicide region, wherein a first set of two adjacent first portions of the plurality of first portions sandwich and physically contact the first resistance region, wherein a second set of two adjacent first portions of the plurality of first portions sandwich and physically contact the second resistance region, wherein the second resistance region is separated from the first resistance region, wherein a third set of two adjacent first portions of the plurality of first portions sandwich and physically contact the silicide region, and wherein the second resistance is greater than the first resistance, and no gate structure is disposed on the first resistance region;
   a plurality of trench isolations in the first portions of the semiconductor substrate;
   a sacrificial layer covering a top surface of the first resistance region, wherein the second resistance region is free from coverage by the sacrificial layer;
   a first protect oxide layer covering a top surface of the sacrificial layer, wherein the first protect oxide layer together with the sacrificial layer have a first thickness;

a second protect oxide layer covering a top surface of the second resistance region, wherein the second protect oxide layer has a second thickness smaller than the first thickness; and a silicide layer on the silicide region.

2. The device of claim 1, wherein a doping concentration of the first resistance region is in a range from $10^{14}$ to $10^{16}/cm^3$.

3. The device of claim 2, wherein a doping concentration of the second resistance region is in a range from $10^{11}/cm^3$ to $10^{14}/cm^3$.

4. The device of claim 1, wherein the first thickness is in a range from 10 to 110 nm and the second thickness is greater than 0 and smaller than or equal to 30 nm.

5. The device of claim 1, wherein the first resistance region, the second resistance region, and the silicide region comprise boron-doped, phosphor-doped, arsenic-doped, or carbon-doped portions.

6. The device of claim 1, wherein the first resistance is in a range from 100 Ohm/sqr to 400 Ohm/sqr.

7. The device of claim 1, wherein the second resistance is in a range from 300 Ohm/sqr to 3000 Ohm/sqr.

8. The device of claim 1, wherein the first protect oxide layer comprises silicon oxide, silicon oxynitride (SiON), silicon nitride, or a composite thereof.

9. The device of claim 1, wherein the second protect oxide layer comprises silicon oxide, silicon oxynitride (SiON), silicon nitride, or a composite thereof.

10. The device of claim 1, wherein the second resistance region is in contact with the second protect oxide layer.

11. The device of claim 1, wherein the entire first protect oxide layer is between the first set of two adjacent first portions of the plurality of first portions and the entire second protect oxide layer is between the second set of two adjacent first portions of the plurality of first portions.

12. The device of claim 11, wherein the first protect oxide layer is above the second protect oxide layer.

* * * * *